United States Patent
Zhang et al.

(10) Patent No.: US 7,838,377 B2
(45) Date of Patent: Nov. 23, 2010

(54) POWER SEMICONDUCTOR DEVICES WITH MESA STRUCTURES AND BUFFER LAYERS INCLUDING MESA STEPS

(75) Inventors: Qingchun Zhang, Cary, NC (US); Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 80 days.

(21) Appl. No.: 12/207,028

(22) Filed: Sep. 9, 2008

(65) Prior Publication Data

US 2009/0121319 A1 May 14, 2009

Related U.S. Application Data

(60) Provisional application No. 60/986,694, filed on Nov. 9, 2007.

(51) Int. Cl.
*H01L 21/331* (2006.01)
(52) U.S. Cl. ............... 438/343; 438/39; 438/41; 438/496; 438/571; 438/586; 257/170; 257/542; 257/466; 257/618; 257/623; 257/E29.185; 257/E29.321; 257/E21.377
(58) Field of Classification Search .......... 438/39, 438/41, 343, 496, 586; 257/170, 452, 466, 257/618, 623, 624, 496, 586, E29.185, 329, 257/E21.377
See application file for complete search history.

(56) References Cited

U.S. PATENT DOCUMENTS

| | | | |
|---|---|---|---|
| 4,927,772 A | 5/1990 | Arthur et al. .......... | 437/6 |
| 5,914,500 A | 6/1999 | Bakowski et al. ...... | 257/77 |
| 5,977,605 A * | 11/1999 | Bakowsky et al. ...... | 257/496 |
| 6,696,705 B1 | 2/2004 | Barthelmess et al. ... | 257/104 |

| | | |
|---|---|---|
| 2007/0120148 A1 | 5/2007 | Nogome |

(Continued)

FOREIGN PATENT DOCUMENTS

EP   1 806 787 A1   7/2007

(Continued)

OTHER PUBLICATIONS

Katsunori Ueno, Tatsue Urushidani, Kouichi Hahimoto, and Yasukazu Seki. "The Guard -Ring Termination for the High-Voltage SiC Schottky Barrier Diodes." *IEEE Electron Device Letters*. vol. 16. No. 7, Jul. 1995.

(Continued)

*Primary Examiner*—Charles D Garber
*Assistant Examiner*—Yasser A Abdelaziez
(74) *Attorney, Agent, or Firm*—Myers Bigel Sibley & Sajovec (57) ABSTRACT

A bipolar junction transistor includes a collector having a first conductivity type, a drift layer having the first conductivity type on the collector, a base layer on the drift layer and having a second conductivity type opposite the first conductivity type, a lightly doped buffer layer having the first conductivity type on the base layer and forming a p-n junction with the base layer, and an emitter mesa having the first conductivity type on the buffer layer and having a sidewall. The buffer layer includes a mesa step adjacent to and spaced laterally apart from the sidewall of the emitter mesa, and a first thickness of the buffer layer beneath the emitter mesa is greater than a second thickness of the buffer layer outside the mesa step.

15 Claims, 7 Drawing Sheets

U.S. PATENT DOCUMENTS

2007/0241427 A1   10/2007   Mochizuki et al.

FOREIGN PATENT DOCUMENTS

| JP | 3-225870 | 10/1991 |
| WO | 96/03774 | 2/1996 |
| WO | 97/08754 | 3/1997 |
| WO | WO 2006/135031 A2 * | 12/2006 |
| WO | WO 2006/135031 A3 | 12/2006 |
| WO | WO 2007/040710 A1 | 4/2007 |

OTHER PUBLICATIONS

Singh, R. and J.W. Palmour, "Planar Terminations in 4H-SiC Schottky Diodes with Low Leakage and High Yields," *IEEE International Symposium on Power Semiconductor Devices and ICs*, 1997.

International Search Report and Written Opinion (13 pages) corresponding to International Application No. PCT/US2008/010538; Mailing Date: Dec. 22, 2008.

* cited by examiner

POWER SEMICONDUCTOR DEVICES WITH MESA STRUCTURES AND BUFFER LAYERS INCLUDING MESA STEPS

RELATED APPLICATION

The present application claims the benefit of and priority to U.S. Provisional Patent Application No. 60/986,694, filed Nov. 9, 2007, entitled "SILICON CARBIDE BIPOLAR JUNCTION TRANSISTOR," the disclosure of which is hereby incorporated herein by reference in its entirety.

STATEMENT OF GOVERNMENT INTEREST

This invention was made with Government support under contract no. W911 NF-04-2-0022 awarded by Army Research Laboratory. The Government has certain rights in the invention.

BACKGROUND

The present invention relates to microelectronic devices, and more particularly to power semiconductor devices.

High voltage silicon carbide (SiC) devices can handle voltages above about 600V or more. Such devices may handle as much as about 100 amps or more of current, depending on their active area. High voltage SiC devices have a number of important applications, particularly in the field of power conditioning, distribution and control. High voltage semiconductor devices, such as Schottky diodes, MOSFETs, GTOs, IGBTs, BJTs, etc., have been fabricated using silicon carbide.

A conventional SiC power device, such as a SiC Schottky diode structure, has an n-type SiC substrate on which an n− epitaxial layer, which functions as a drift region, is formed. The device typically includes a Schottky contact formed directly on the n− layer. Surrounding the Schottky contact is a p-type JTE (junction termination extension) region that is typically formed by ion implantation. The implants may be aluminum, boron, or any other suitable p-type dopant. The purpose of the JTE region is to reduce electric field crowding at the edges of the junction, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants, such as nitrogen or phosphorus, in order to reduce extension of the depletion region toward the edge of the device.

In addition to junction termination extension (JTE), multiple floating guard rings (MFGR) and field plates (FP) are commonly used termination schemes in high voltage silicon carbide devices. Another conventional edge termination technique is a mesa edge termination. However, the presence of a mesa termination may cause a high electric field to occur at the mesa corner, even if a junction termination extension or guard ring is present. Over-etching of the mesa can exacerbate the problem of electric field crowding at the mesa corner. A high electric field at the mesa corner may result in a much lower breakdown voltage than would otherwise be expected for a given drift layer thickness and doping.

Figure 1:
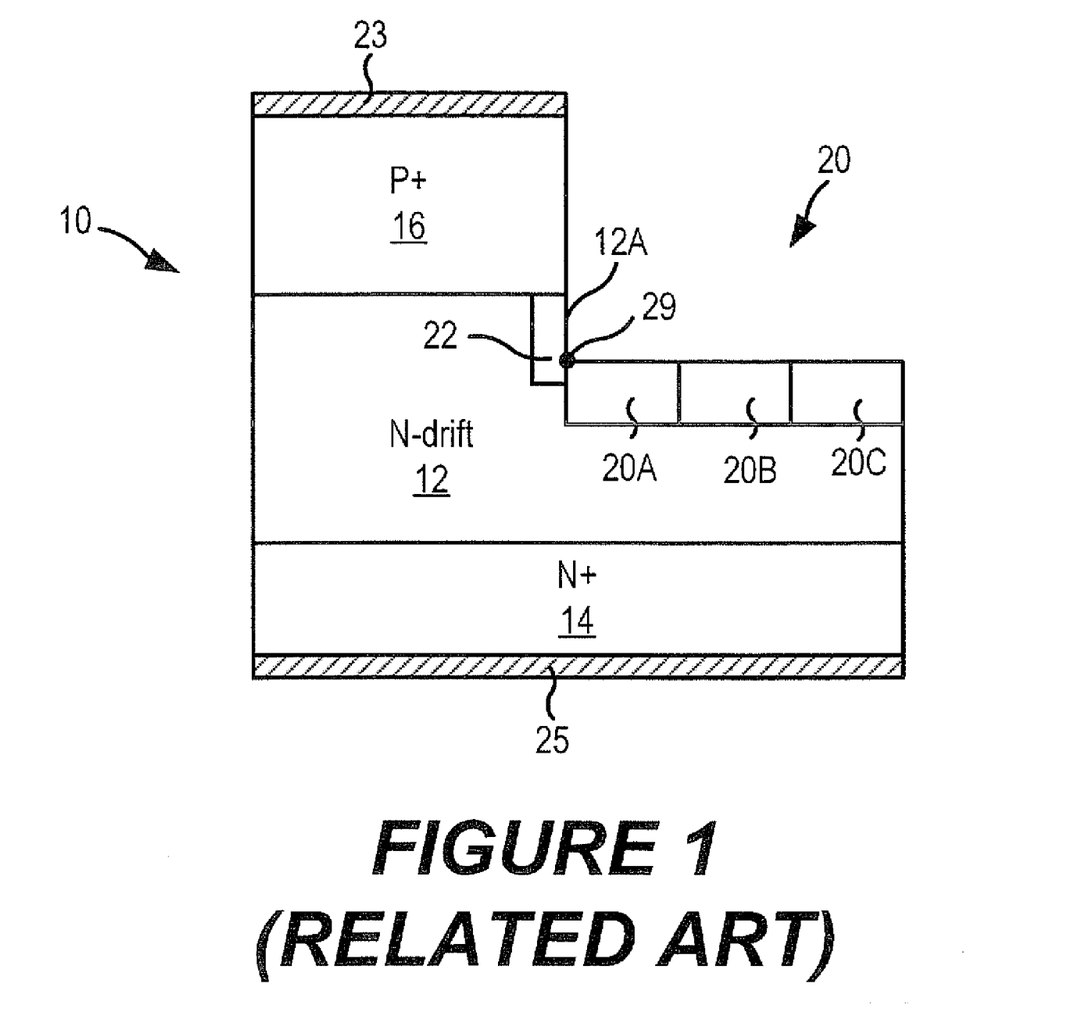
FIG. 1 is a cross-sectional view of a conventional mesa terminated PIN diode structure.

A conventional mesa-terminated PIN diode is illustrated in FIG. 1. As shown therein, a PIN diode 10 includes an n− drift layer 12 between a p+ layer 16 and an n+ substrate 14. FIG. 1 illustrates one half of a PIN-stricture; the structure may include mirror image portions (not shown). An anode contact 23 is on the p+ layer 16, and a cathode contact 25 is on the n+ substrate 14. The p+ layer 16 is formed as a mesa on the n− drift layer 12. A junction termination extension (JTE) region 20 including a plurality of JTE zones 20A, 20B, 20C is provided in the n− drift layer 12 adjacent the p+ mesa 16. The JTE zones 20A, 20B, 20C are p-type regions that may have levels of charge that decrease outwardly with distance from the PN junction between the p+ mesa 16 and the n− drift layer 12. Although three JTE zones 20A, 20B, 20C are illustrated, more or fewer JTE zones may be provided.

As shown in FIG. 1, the n− drift layer 12 adjacent the p+ mesa 16 may be slightly over-etched due, for example, to difficulties in etch process control, so that a sidewall 12A of the n− drift layer 12 beneath the p+ mesa 16 may be exposed. Over-etching of up to about 3000 Å may occur in some cases. To protect the exposed sidewall 12A, a sidewall implant may be performed in which p-type impurities are implanted into the sidewall 12A to form a sidewall implant region 22.

In conventional mesa-terminated structures, such as the PIN diode structure 10 illustrated in FIG. 1, field crowding may occur at or near the mesa corners 29, resulting in high electric field strengths at the corners 29. These high field strengths can reduce the breakdown voltage of the device. For example, a conventional mesa-terminated PIN diode structure that has a theoretical breakdown voltage of 12 kV, based on thickness and doping of the drift layer and the JTE design, may have an effective breakdown voltage of only 8 kV.

In addition to field crowding, another challenge in the development of SiC power bipolar junction transistors (BJTs) is the phenomenon of current gain degradation, that is, a reduction in current gain over time in the device. Current gain degradation is typically attributed to material defects such as basal plane dislocations (BPDs) and to surface recombination, especially along the emitter sidewall and to surface of the base of the device. A slight reduction of current gain degradation on SiC BJTs fabricated on BPD-free wafers has been observed. In addition, the emitter fingers of SiC BJTs are typically formed by reactive ion etching (RIE). The non-uniformity of RIE etching rate can partially or completely etch away the base material around the wafer periphery, which can cause a large reduction in yields.

SUMMARY

A bipolar junction transistor according to some embodiments includes a collector having a first conductivity type, a drift layer having the first conductivity type on the collector, a base layer on the drift layer and having a second conductivity type opposite the first conductivity type, a lightly doped buffer layer having the first conductivity type on the base layer and forming a p-n junction with the more heavily doped base layer, and an emitter mesa having the first conductivity type on the buffer layer and having a sidewall. The buffer layer includes a mesa step adjacent to and spaced laterally apart from the sidewall of the emitter mesa, and a first thickness of the buffer layer beneath the emitter mesa is greater than a second thickness of the buffer layer outside the mesa step.

The bipolar junction transistor may further include a local emitter contact region on the emitter mesa. The local emitter contact region has the first conductivity type and has a doping concentration greater than a doping concentration of the emitter mesa. The local emitter contact region is laterally spaced apart from the sidewall of the emitter mesa. An emitter ohmic contact is on the local emitter contact region.

The local emitter contact region may be spaced from the sidewall of the emitter mesa by a distance of about 2 µm or more.

The bipolar junction transistor may further include a conduction layer on the sidewall of the emitter mesa and extending to contact both the local emitter contact region and the buffer layer. The emitter ohmic contact may form an ohmic contact with the conduction layer.

The bipolar junction transistor may further include a base contact region extending into the base layer and having the second conductivity type and having a doping concentration greater than a doping concentration of the base layer. A base ohmic contact is on the base contact region.

The mesa step may have a height of about 0.3 µm or less. Furthermore, the mesa step may be spaced apart from the sidewall of the emitter mesa by a distance of about 2 µm or more.

The buffer layer may have a doping concentration that is less than a doping concentration of the base layer. In some embodiments, the buffer layer may have a doping concentration selected such that a portion of the buffer layer having the second thickness is fully depleted by the built-in potential of the p-n junction between the buffer layer and the base layer.

The collector, the drift layer, the base layer, the buffer layer and the emitter mesa include silicon carbide.

A power semiconductor device according to some embodiments includes a first layer having a first conductivity type, a second layer on the first layer, the second layer having a second conductivity type opposite the first conductivity type and having a second doping concentration higher than a first doping concentration of the first layer. A third layer having the first conductivity type is on the second layer and forms a p-n junction with the second layer. The third layer has a third doping concentration lower than the second doping concentration of the second layer. A mesa having the first conductivity type is the third layer and has a sidewall. The buffer layer may include a mesa step adjacent to and spaced laterally apart from the sidewall of the mesa. A first thickness of the third layer beneath the mesa is greater than a second thickness of the third layer outside the mesa step.

The power semiconductor device may further include a contact region on the mesa, the contact region having the first conductivity type and having a fourth doping concentration greater than a fifth doping concentration of the mesa and being laterally spaced apart from the sidewall of the mesa. An ohmic contact is on the contact region.

The power semiconductor device may further include a conduction layer on the sidewall of the mesa and extending to contact both the contact region and the buffer layer, and the ohmic contact may form an ohmic contact with the conduction layer.

Methods of forming an electronic device according to some embodiments include providing a drift layer having a first conductivity type, providing a semiconductor layer on the drift layer, the semiconductor layer having a second conductivity type opposite the first conductivity type, providing a buffer layer having the first conductivity type on the semiconductor layer, and selectively etching the buffer layer to form a mesa step that defines a first portion of the buffer layer having a first thickness and a second portion of the buffer layer having a second thickness that is less than the first thickness. The methods further include providing a mesa on the first portion of the buffer layer, the mesa having the first conductivity type and having a mesa sidewall and that partially exposes the first portion of the buffer layer and that is laterally spaced apart from the mesa step of the buffer layer.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p×−, or the like), to indicate a relatively larger ("+") or smaller ("−") concentration of majority carriers compared to another layer or region. However, such notation does not imply the existence of a particular concentration of majority or minority carriers in a layer or region.

As noted above, silicon carbide (SiC) Bipolar Junction Transistors (BJT) are considered to be appropriate devices for high power, high temperature, and/or high frequency applications. However, such devices can suffer from current gain degradation in which current-voltage characteristics of the devices deteriorate over time and/or with operating stress. Conventional technology addresses current degradation in SiC BJT devices by incorporating a ledge layer deposited on the device surface by epitaxial regrowth. However, the crystal damage caused by an RIE and/or inductively coupled plasma (ICP) dry etching process after forming the ledge is not removed, with the result that the surface recombination velocity may not be improved significantly. During the on-state of the BJT device, collector current crowding aggravates the carrier recombination on the emitter sidewall, which may enhance Auger recombination and/or interface trap generation.

Embodiments of the present invention may reduce and/or eliminate surface recombination along the emitter sidewall and/or on the base top-surface, thus potentially reducing and/or eliminating current gain degradation.

A device stricture according to some embodiments of the invention may include one or more features that may, alone or collectively, reduce interface trap generation by altering the current conduction path through the device. In some embodiments, altering the current conduction path through the device may reduce and/or alleviate problems that may arise from the use of dry etching.

Embodiments of the invention in an NPN BJT structure are described below. However, the invention may be embodied in many other power bipolar devices, such as IGBTs, GTOs, etc.

Figure 2:
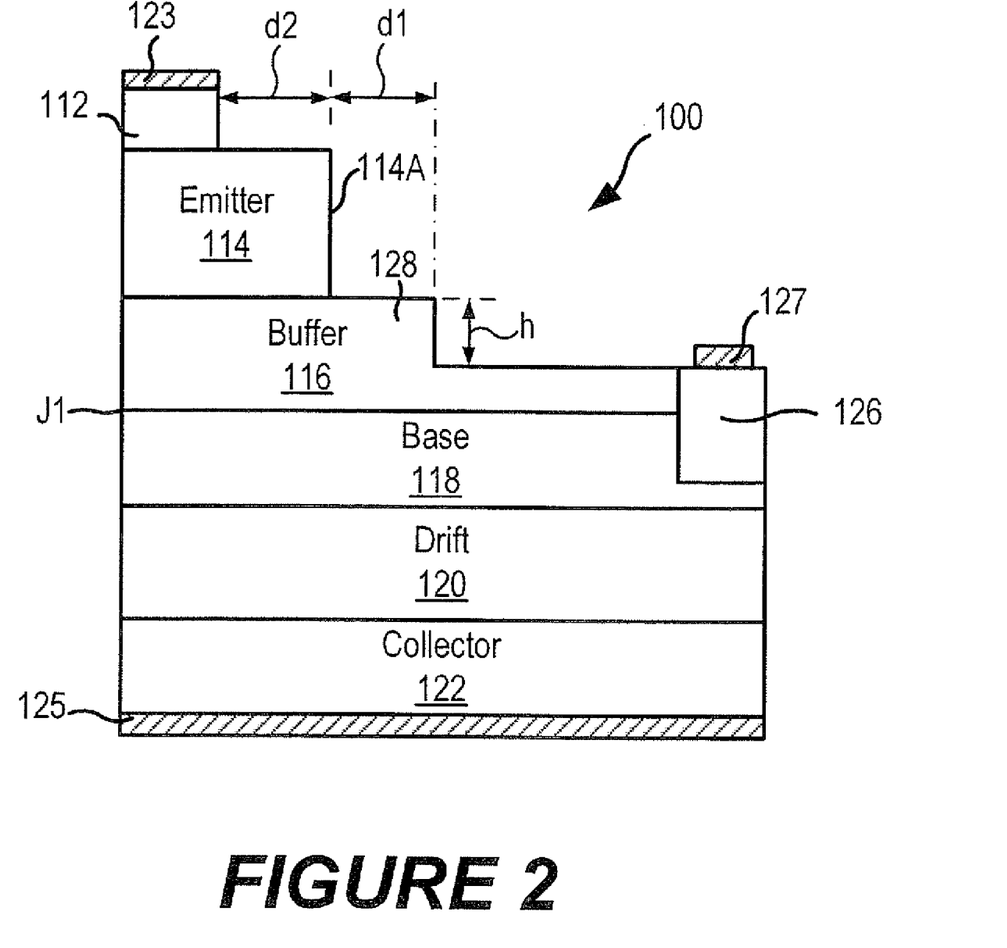
FIGS. 2 and 3 are cross-sectional views of bipolar junction transistor structures according to some embodiments of the present invention.

A simplified cross-sectional view of a BJT 100 according to some embodiments is shown in FIG. 2. The BJT structure 100 includes a collector 122 having a first conductivity type (i.e. n-type or p-type), a lightly doped drift layer 120 on the collector 122 and having the first conductivity type, and base layer 118 on the drift layer 120 and having a second conductivity type (i.e. p-type or n-type) opposite the first conductivity type. The base layer 118 is more heavily doped than the drift layer, and may, for example, have a doping concentration of about $3 \times 10^{17}$ cm$^{-3}$ to about $5 \times 10^{18}$ cm$^{-3}$.

The semiconductor layers in the structure 100 may be formed as epitaxial and/or implanted regions of silicon carbide. However, it will be appreciated that structures according to some embodiments can be formed using other materials/methods.

For example, the drift layer 120 may be formed from silicon carbide of the 2H, 4H, 6H, 3C and/or 15R polytype having a doping concentration of about $2 \times 10^{14}$ to about $1 \times 10^{17}$ cm$^{-3}$. The thickness and doping of the drift layer 120 may be chosen to provide a desired blocking voltage and/or on-resistance. For example, for a device having a blocking voltage of 10 kV, the drift layer 120 may have a thickness of about 100 μm and a doping of about $2 \times 10^{14}$ cm$^{-3}$.

The collector 122 may be a growth substrate, and in some embodiments may include a bulk single crystal of 2H, 4H, 6H, 3C and/or 15R polytype on- or off-axis silicon carbide. The collector 122 may have a doping concentration of about $1 \times 10^{18}$ cm$^{-3}$ to about $5 \times 10^{20}$ cm$^{-3}$. In some embodiments, the drift layer 120 may comprise a bulk single crystal 4H— or 6H—SiC substrate, and the collector 122 may comprise an implanted or epitaxial region on the drift layer 120.

A lightly doped buffer layer 116 having the first conductivity type is formed on the base layer 118, and an emitter mesa 114 having the first conductivity type is formed on the buffer layer 116. Because the buffer layer 116 and the base layer 118 have opposite conductivity types, a metallurgical p-n junction J1 is formed at the interface between the buffer layer 116 and the base layer 118. The buffer layer 116 may have a doping concentration that is less than the base layer, so that the depletion region of the p-n junction J1 may extend far enough into the buffer layer 116 to deplete a significant portion of the buffer layer 116.

The buffer layer 116 includes a mesa step 128 adjacent the emitter mesa 114. The mesa step 128 in the buffer layer 116 may reduce current crowding at the emitter/base corner by providing a step at the mesa corner. Furthermore, the mesa step 128 may provide an increased resistance that may cause the base current to retreat away from the surface of the buffer layer 116.

The mesa step 128 may be formed by selectively etching the lightly doped buffer layer 116 on the top of the base layer 118. For example, the buffer layer 116 may be formed as an epitaxial layer having a thickness of about 0.3 μm to about 0.5 μm, on the base layer 118. The buffer layer 116 may have a doping concentration of about $1×10^{16}$ cm$^{-3}$ to about $5×10^{17}$ cm$^{-3}$, and in particular about $1×10^{17}$ cm$^{-3}$. The buffer layer 116 may be masked and anisotropically etched to reduce a thickness of a portion of the buffer layer 116 to a thickness of about 0.3 μm. The height (h) of the mesa step 128 may be about 0.4 μm or less, and in some embodiments may be about 0.3 μm or less. The mesa step 128 may be positioned a distance (d1) of about 2 μm or more from a sidewall 114A the emitter mesa 114.

A heavily doped base contact region 126 (e.g., greater than about $1×10^{19}$ cm$^{-3}$) having the second conductivity type may be formed, for example, by epitaxial regrowth, and a base ohmic contact 127 may be formed thereon. The base contact region 126 may extend through and/or adjacent to the buffer layer 116 into the base layer 118. A collector ohmic contact 125 is formed on the collector 122. The formation of ohmic contacts to n-type and p-type silicon carbide is well known in the art.

The portion of the buffer layer 116 etched to form the step 128 may be etched to a thickness that will be fully depleted by the built-in potential of the metallurgical junction J1 between the base layer 118 and the buffer layer 116. That is, the doping of the buffer layer 116 may be chosen in conjunction with the thickness to make the etched portion of the buffer layer 116 fully depleted by the built-in potential of the junction J1 (although in some embodiments, portions of the buffer layer 116 may be only partially depleted).

Because portions of the buffer layer 116 are depleted by the built-in potential of the junction J1, the buffer layer 116 can act as an etching stopper for etching the mesa step 128. That is, depth control of the etch may be performed by probing the etched surface and applying a voltage to the etched surface during etching. A level of current passing through the probes in response to the applied voltage changes as the carrier concentration of the layer being etched changes.

In some embodiments, the thicker portion of the buffer layer 116 may be only partially depleted by the built-in potential of the base/buffer junction J1, while still reducing current crowding at the emitter/base corner.

In some embodiments, an optional local emitter contact region 112 may be formed on the emitter mesa 114. An emitter contact 123 may be formed on the local emitter contact region 112. The local emitter contact region 112 may have a width that is smaller than a width of the emitter mesa 114. Thus, an edge of the local emitter contact region 112 facing the mesa step 128 is laterally spaced apart from the edge of the emitter mesa 114. In some embodiments, the edge of the local emitter contact region 112 may be located a distance (d2) that is more than 2 μm from the sidewall 114A of the emitter mesa 114 to provide a current conduction path that is laterally spaced away from the sidewall 114A of the emitter mesa 114.

The local emitter contact region 112 may be heavily doped (e.g., greater than about $1×10^{19}$ cm$^{-3}$) for obtaining good ohmic contact thereto, while the doping of the emitter mesa 114 may be less than about $2×10^{18}$ cm$^3$.

Due to the lateral resistance of the emitter mesa 114, the collector current in the on-state may conduct away from the sidewall 114A of the emitter mesa 114, thus potentially reducing generation of interface traps along the sidewall 114A of the emitter mesa 114.

Figure 3:
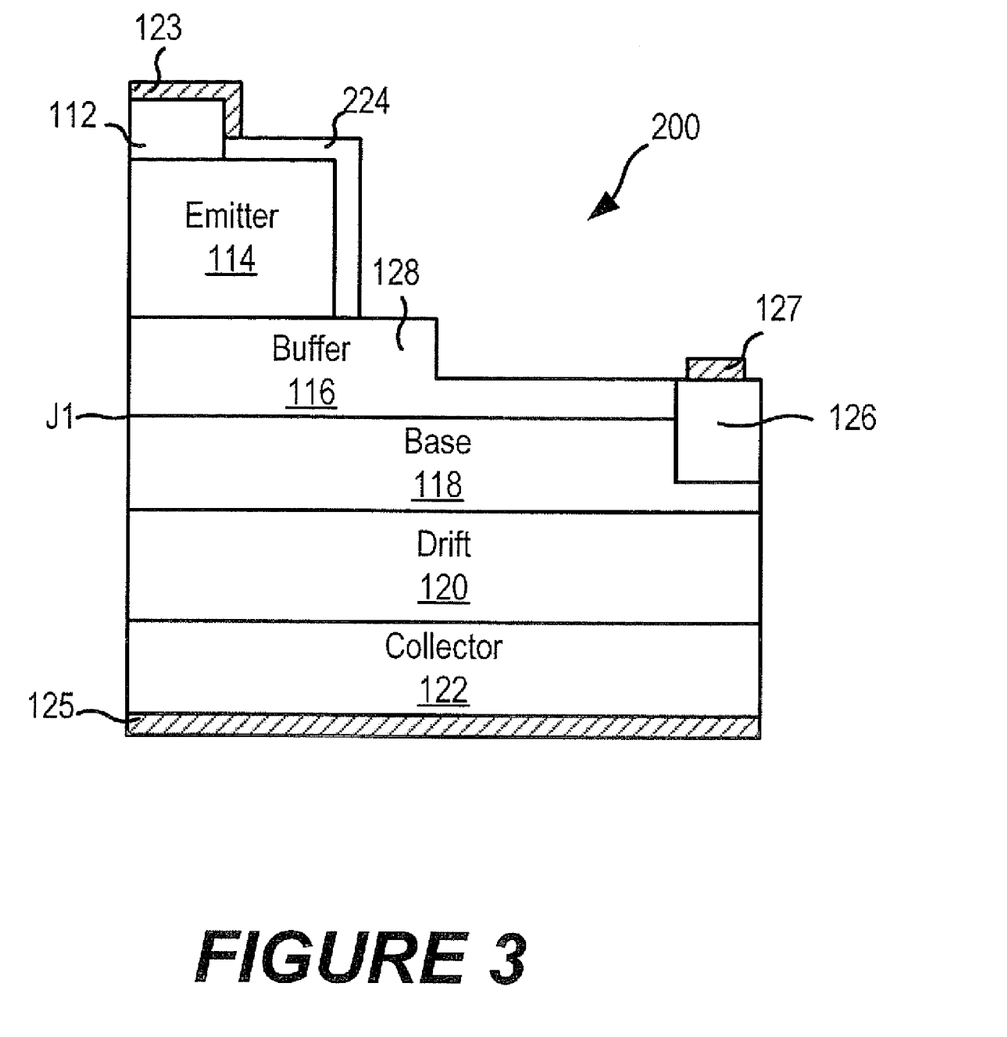

Further embodiments of the invention are illustrated in FIG. 3. As shown therein, an optional conduction layer 224 of second conductivity type material may be formed on upper and side surfaces of the emitter mesa 114. The conduction layer 224 may be heavily doped. At one end thereof, the conduction layer 224 forms an ohmic contact to the emitter contact 123. At the other end, the conduction layer 224 terminates on the buffer layer 116 between the emitter mesa 114 and the mesa step 128. The conduction layer 224 may act as a sink to carriers injected from the base layer 118 (e.g., holes, when the base 118 is p-type), thus reducing the possibility of recombination of such carriers with opposite conductivity type carriers (e.g., electrons) provided by the emitter 114.

The conduction layer 224 can be formed by epitaxial regrowth, for example, at same type as the base contact region 126 is formed. The regrown epitaxial layer may be selectively etched, leaving some of the regrown epitaxial material on the emitter mesa 114.

Figure 4A:
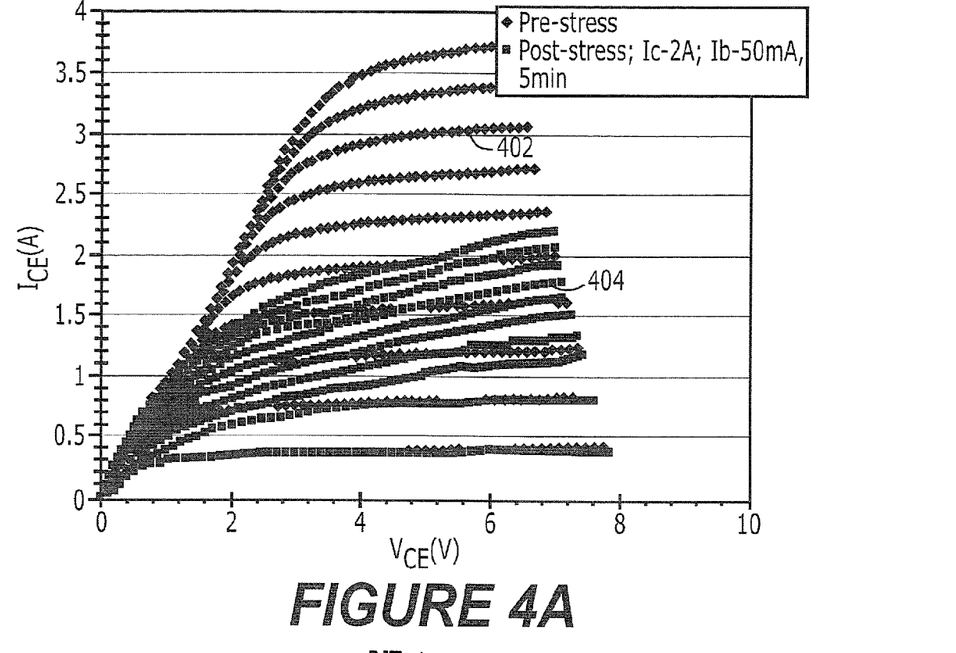
FIGS. 4A and 4B are graphs comparing the degradation behaviors of conventional bipolar junction transistor structures and bipolar junction transistor structures according to embodiments of the invention
Figure 4B:
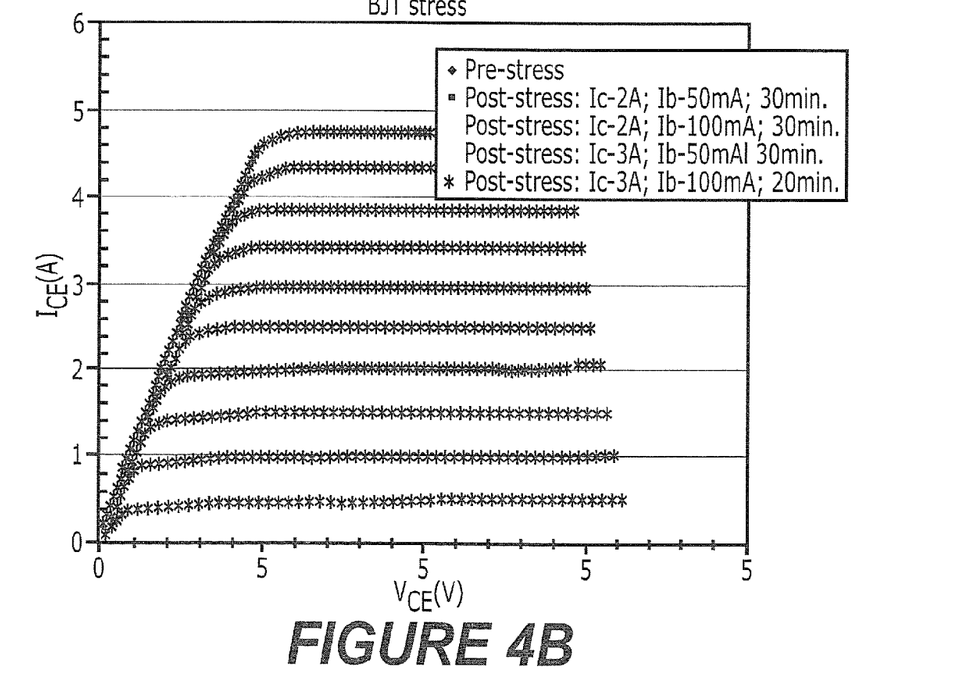

FIGS. 4A and 4B compare the current degradation behaviors of BJTs with conventional structures and structures according to embodiments of the invention fabricated on the same wafer. In particular, FIG. 4A shows current-voltage characteristics of a conventional SiC BJT structure before (curves 402) and after (curves 404) current stress of Ic=2A, and Ib=50 mA for 5 minutes. Significant current degradation is observed in FIG. 4A.

FIG. 4B shows current-voltage characteristics (curves 406) of a SiC BJT structure including a mesa step, a conduction layer and a local emitter, according to some embodiments. No significant degradation is observed in this structure, even after current stress of Ic=3A, and Ib=100 mA for 20 minutes.

Figure 5:
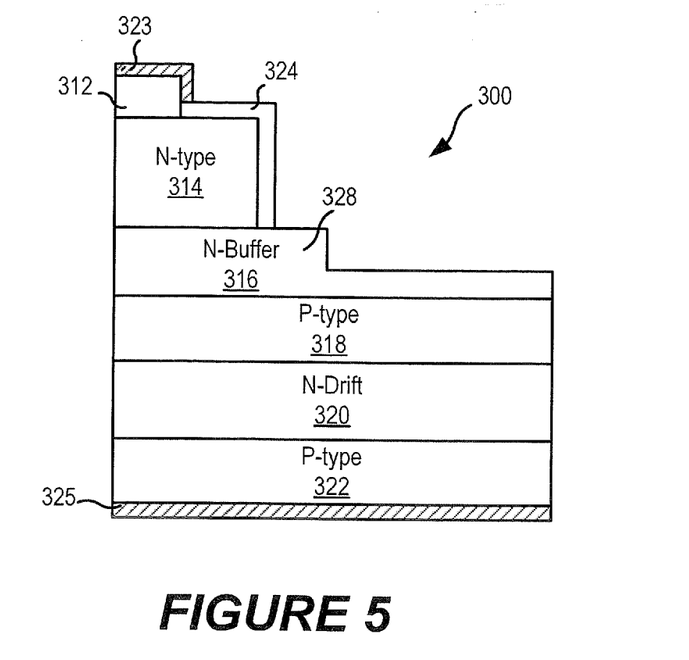
FIGS. 5 and 6 are cross-sectional views of device structures according to further embodiments of the present invention.
Figure 6:
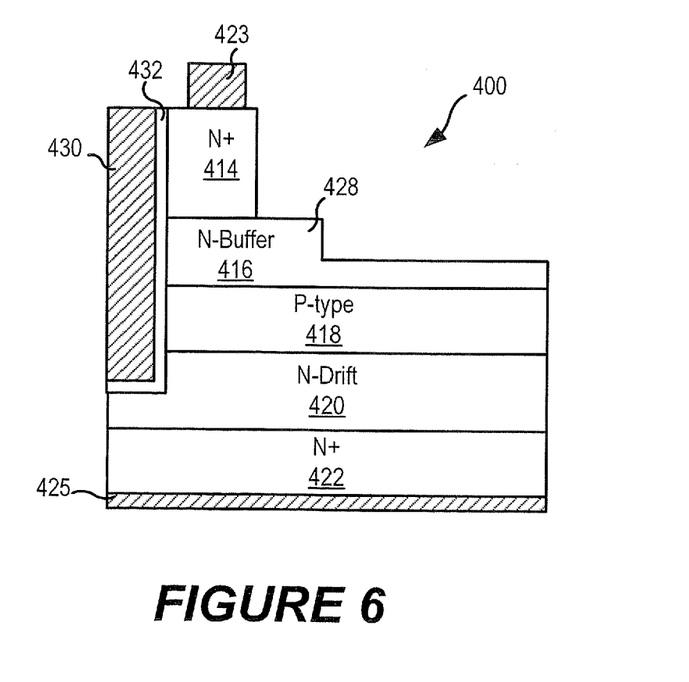

FIGS. 5 and 6 illustrate other types of devices in which various embodiments of the invention may be employed. In each case, the device includes a drift layer and a buffer layer that includes a mesa step. As illustrated in the embodiments of FIGS. 5 and 6, the drift layer of the device may be p-type or n-type, and the buffer layer and buried junction may have the opposite conductivity type (i.e. n-type or p-type).

FIG. 5 illustrates an n-type gate turn-off (GTO) thyristor 300 according to some embodiments. The GTO 300 includes an n-type drift layer 320 on an p-type layer 322. A p-type layer 318 is formed on the n-type drift layer 320. An n-type buffer layer 316 including a mesa step 328 is formed on the p-type layer 318. An n-type mesa 314 is formed on the n-type buffer layer 316, and an n+ contact layer 312 is formed on the n-type mesa 314. The buffer layer 316 forms a mesa step 328 that extends over the p-type layer 318 past a sidewall of the mesa 314. A p-type conduction layer 324 is on the sidewall of the mesa 314 and contacts the buffer layer 316. A cathode contact 323 forms an ohmic contact with the n+ contact layer 312 as well as the conduction layer 324. An anode contact 325 is on the p-type layer 322. Although not illustrated in FIG. 5, a gate contact may be formed on the p-type layer 322.

FIG. 6 illustrates a UMOSFET (U-shaped metal-oxide-semiconductor field effect transistor) structure 400 according to some embodiments includes an n-type drift layer 420 on an n+drain layer 422. A p-type body layer 418 is formed on the n-type drift layer 420. An n-type buffer layer 416 including a mesa step 428 is formed on the p-type body layer 418. An n-type source mesa 414 is formed on the n-type buffer layer 416. The buffer layer 416 forms a mesa step 428 that extends over the p-type body layer 418 past a first sidewall of the source mesa 414. A gate oxide 432 is formed on a second surface of the source mesa 414 opposite the first surface, and a gate electrode 430 is on the gate oxide 432. A source ohmic contact 423 is on the source mesa 414, and a drain ohmic contact 425 is on the n+ drain layer 422.

Figure 7A:
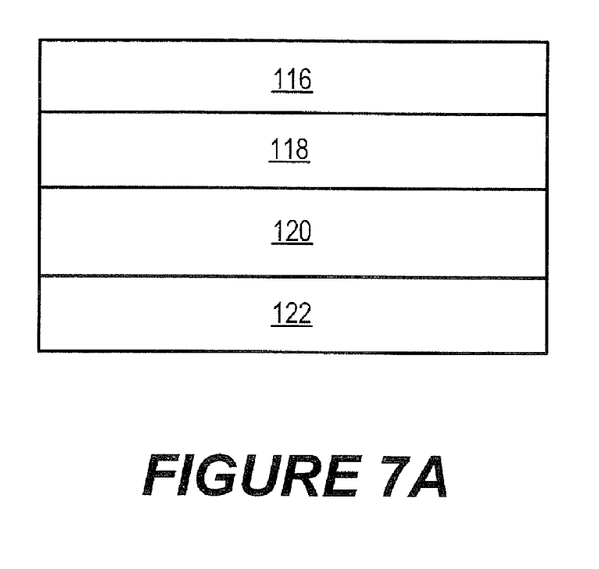
FIGS. 7A to 7D are cross-sectional views that illustrate formation of a semiconductor device according to some embodiments.

FIGS. 7A to 7D are cross-sectional views that illustrate formation of a semiconductor device according to some embodiments. Referring to FIG. 7A, a drift layer 120 having a first conductivity type is formed as an epitaxial semiconductor layer on a collector layer 122 having the first conductivity type. The collector layer 122 may, for example, be an n+ silicon carbide substrate. A base layer 118 having a second conductivity type opposite the first conductivity type is formed on the drift layer 120. A lightly doped buffer layer 116 having the first conductivity type is formed on the base layer 118. The buffer layer 116 has a lower doping concentration than the base layer 118 and forms a p-n junction with the base layer 118.

Figure 7B:
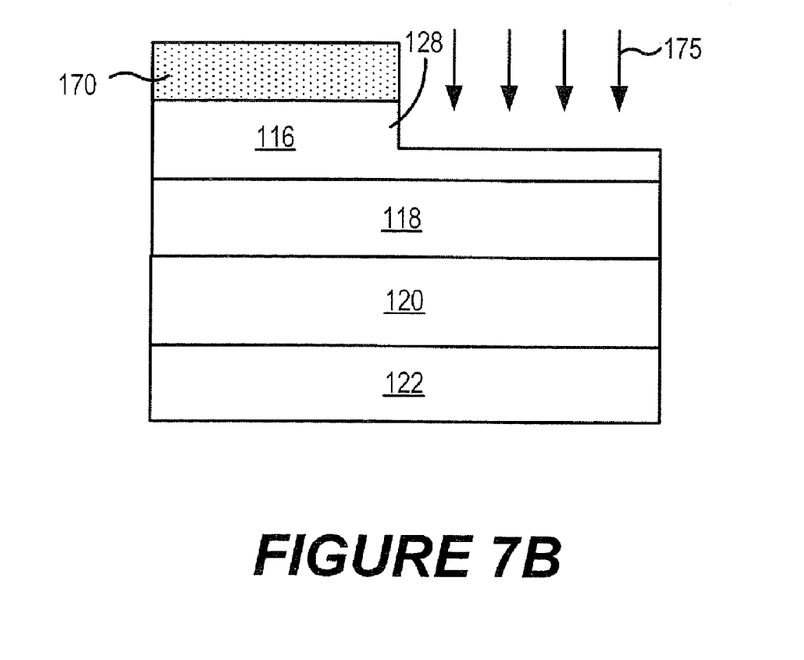

Referring to FIG. 7B, a mask 170 is formed on the buffer layer 116 and is selectively patterned to expose portions of the buffer layer 116. The buffer layer is then etched, for example using reactive ion etching 175, to form a mesa step 128 that defines a first portion of the buffer layer having a first thickness and a second portion of the buffer layer having a second thickness that is less than the first thickness.

Figure 7C:
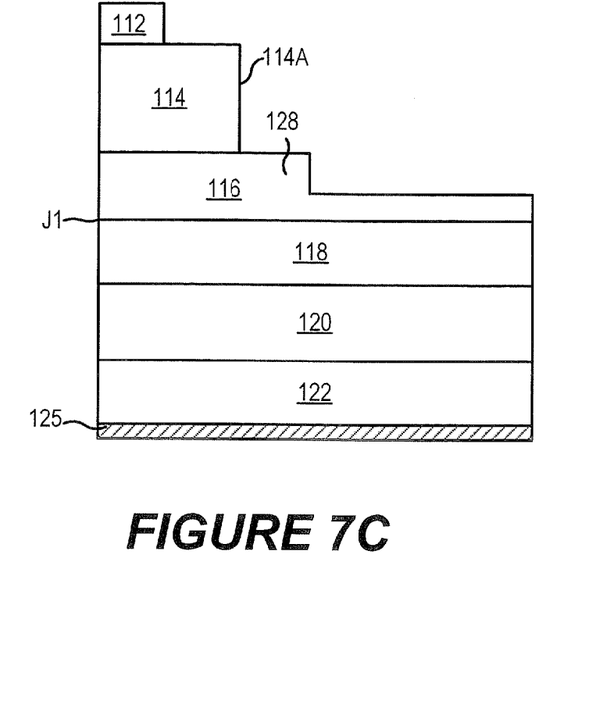

Referring to FIG. 7C, the mask 170 is removed and an emitter mesa 114 having the first conductivity type is formed on the first portion of the buffer layer. The emitter mesa 114 can be formed, for example, by masking and epitaxial regrowth. In some embodiments, the emitter mesa can be formed by masking and etching an epitaxial layer. The emitter mesa 114 has a mesa sidewall 114A. The emitter mesa 114 partially exposes the first portion of the buffer layer and is the mesa sidewall 114A is laterally spaced apart from the mesa step 128. A local emitter contact region 112 having the first conductivity type is formed on the mesa 114. The local emitter contact region 112 may be spaced apart from the mesa sidewall 114A.

Figure 7D:
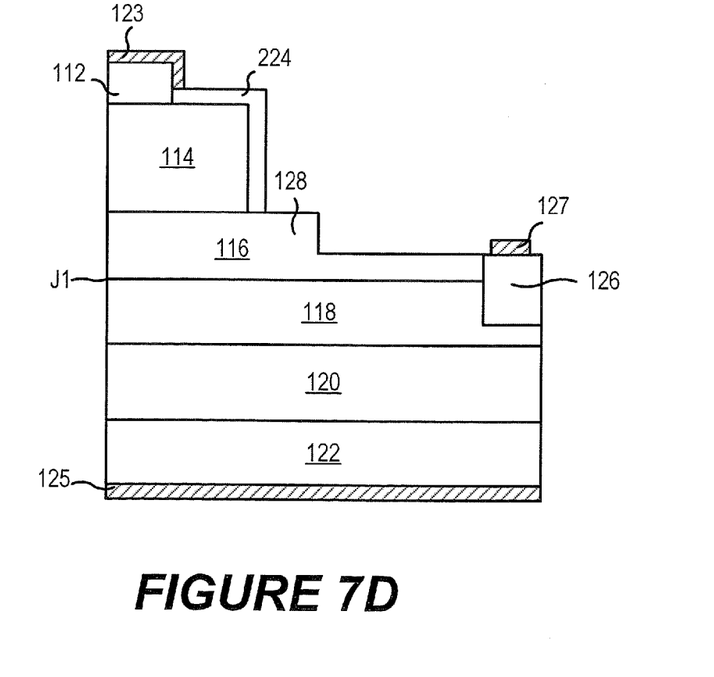

Referring to FIG. 7D, a conduction layer 224 may be formed on the sidewall 114A of the emitter mesa 114. The conduction layer 224 may have the second conductivity type and may extend from the buffer layer 116 to the local emitter contact region 112. A heavily doped base contact region 126 may be provided in contact with the base layer 118. The conduction layer 224 and the base contact region 126 may be formed, for example, by masking and epitaxial regrowth. Ohmic contacts 123, 125 and 127 may be formed on the local emitter contact region 112, the collector layer 122 and the base contact layer 127, respectively.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bipolar junction transistor, comprising:
    a collector having a first conductivity type;
    a drift layer having the first conductivity type on the collector;
    a base layer on the drift layer and having a second conductivity type opposite the first conductivity type;
    a buffer layer having the first conductivity type on the base layer and forming a p-n junction with the base layer, wherein the buffer layer has a doping concentration less than a doping concentration of the base layer; and
    an emitter mesa having the first conductivity type on the buffer layer and having a sidewall;
    wherein the buffer layer comprises a mesa step adjacent to and spaced laterally apart from the sidewall of the emitter mesa, a first thickness of the buffer layer beneath the emitter mesa being greater than a second thickness of the buffer layer outside the mesa step.

2. The bipolar junction transistor of claim 1, further comprising:
    a local emitter contact region on the emitter mesa, the local emitter contact region having the first conductivity type and having a doping concentration greater than a doping concentration of the emitter mesa and being laterally spaced apart from the sidewall of the emitter mesa; and
    an emitter ohmic contact on the local emitter contact region.

3. The bipolar junction transistor of claim 2, wherein the local emitter contact region is spaced from the sidewall of the emitter mesa by a distance of about 2 μm or more.

4. A bipolar junction transistor, comprising:
    a collector having a first conductivity type;
    a drift layer having the first conductivity type on the collector;
    a base layer on the drift layer and having a second conductivity type opposite the first conductivity type;
    a buffer layer having the first conductivity type on the base layer and forming a p-n junction with the base layer, wherein the buffer layer has a doping concentration less than a doping concentration of the base layer;
    an emitter mesa having the first conductivity type on the buffer layer and having a sidewall wherein the buffer layer comprises a mesa step adjacent to and spaced laterally apart from the sidewall of the emitter mesa, a first thickness of the buffer layer beneath the emitter mesa being greater than a second thickness of the buffer layer outside the mesa step;
    a local emitter contact region on the emitter mesa, the local emitter contact region having the first conductivity type and having a doping concentration greater than a doping concentration of the emitter mesa and being laterally spaced apart from the sidewall of the emitter mesa;
    an emitter ohmic contact on the local emitter contact region; and
    a conduction layer on the sidewall of the emitter mesa and extending to contact both the local emitter contact region and the buffer layer, wherein the emitter ohmic contact forms an ohmic contact with the conduction layer.

5. The bipolar junction transistor of claim 3, further comprising:
    a base contact region extending into the base layer, the base contact region having the second conductivity type and having a doping concentration greater than a doping concentration of the base layer; and
    a base ohmic contact on the base contact region.

6. The bipolar junction transistor of claim 1, further comprising:
    a base contact region extending into the base layer, the base contact region having the second conductivity type and having a doping concentration greater than a doping concentration of the base layer; and
    a base ohmic contact on the base contact region.

7. The bipolar junction transistor of claim 1, wherein the mesa step has a height of about 0.3 μm or less.

8. The bipolar junction transistor of claim 1, wherein the mesa step is spaced apart from the sidewall of the emitter mesa by a distance of about 2 μm or more.

9. The bipolar junction transistor of claim 1, wherein the buffer layer has a doping concentration that is less than a doping concentration of the emitter mesa.

10. A bipolar junction transistor, comprising:
a collector having a first conductivity type;
a drift layer having the first conductivity type on the collector;
a base layer on the drift layer and having a second conductivity type opposite the first conductivity type;
a buffer layer having the first conductivity type on the base layer and forming a p-n junction with the base layer buffer layer has a doping concentration less than a doping concentration of the base layer; and
an emitter mesa having the first conductivity type on the buffer layer and having a sidewall;
wherein the buffer layer comprises a mesa step adjacent to and spaced laterally apart from the sidewall of the emitter mesa, a first thickness of the buffer layer beneath the emitter mesa being greater than a second thickness of the buffer layer outside the mesa step; and
wherein the buffer layer has a doping concentration selected such that a portion of the buffer layer having the second thickness is fully depleted by the built-in potential of the p-n junction between the buffer layer and the base layer.

11. The bipolar junction transistor of claim 1, wherein the collector, the drift layer, the base layer, the buffer layer and the emitter mesa comprise silicon carbide.

12. A power semiconductor device, comprising:
a first layer having a first conductivity type;
a second layer on the first layer, the second layer having a second conductivity type opposite the first conductivity type and having a second doping concentration higher than a first doping concentration of the first layer;
a third layer having the first conductivity type on the second layer and forming a p-n junction with the second layer, the third layer having a third doping concentration lower than the second doping concentration of the second layer; and
a mesa having the first conductivity type on the third layer and having a sidewall;
wherein the third layer comprises a mesa step adjacent to and spaced laterally apart from the sidewall of the mesa, a first thickness of the third layer beneath the mesa being greater than a second thickness of the third layer outside the mesa step.

13. The power semiconductor device of claim 12, further comprising:
a contact region on the mesa, the contact region having the first conductivity type and having a fourth doping concentration greater a fifth doping concentration of the mesa and being laterally spaced apart from the sidewall of the mesa; and
an ohmic contact on the contact region.

14. A power semiconductor device, comprising:
a first layer having a first conductivity type;
a second layer on the first layer, the second layer having a second conductivity type opposite the first conductivity type and having a second doping concentration higher than a first doping concentration of the first layer;
a third layer having conductivity type second layer and forming a junction with the second layer, the third layer having a third doping concentration lower than the second doping concentration of the second layer;
a mesa having the first conductivity type on the third layer and having a sidewall, wherein the third layer comprises a mesa step adjacent to and spaced laterally apart from the sidewall of the mesa, a first thickness of the third layer beneath the mesa being greater than a second thickness of the third layer outside the mesa step;
a contact region on the mesa, the contact region having the first conductivity type and having a fourth doping concentration greater a fifth doping concentration of the mesa and being laterally spaced apart from the sidewall of the mesa;
an ohmic contact on the contact region; and
a conduction layer on the sidewall of the mesa and extending to contact both the contact region and the third layer, wherein the ohmic contact forms an ohmic contact with the conduction layer.

15. A method of forming an electronic device, comprising:
providing a drift layer having a first conductivity type;
providing a semiconductor layer on the drift layer, the semiconductor layer having a second conductivity type opposite the first conductivity type;
providing a buffer layer having the first conductivity type on the semiconductor layer and forming a p-n junction with the semiconductor layer, wherein the buffer layer has a doping concentration less than a doping concentration of the semiconductor layer;
selectively etching the buffer layer to form a mesa step that defines a first portion of the buffer layer having a first thickness and a second portion of the buffer layer having a second thickness that is less than the first thickness; and
providing a mesa on the first portion of the buffer layer, the mesa having the first conductivity type and having a mesa sidewall and that partially exposes the first portion of the buffer layer and that is laterally spaced apart from the mesa step of the buffer layer.

* * * * *

UNITED STATES PATENT AND TRADEMARK OFFICE
CERTIFICATE OF CORRECTION

PATENT NO. : 7,838,377 B2  
APPLICATION NO. : 12/207028  
DATED : November 23, 2010  
INVENTOR(S) : Zhang et al.

Page 1 of 1

It is certified that error appears in the above-identified patent and that said Letters Patent is hereby corrected as shown below:

Column 5, Line 49: Please correct "px-" to read -- p– --

Column 10, Claim 4, Line 27: Please correct "sidewall wherein"
  to read -- sidewall, wherein --

Column 11, Claim 10, Lines 8 and 9: Please correct "base layer buffer layer"
  to read -- base layer, wherein the buffer layer --

Column 12, Claim 14, Line 8: Please correct "having conductivity type second layer" to read
  -- having the first conductivity type on the second layer --
  Line 9; Please correct "forming a junction"
  to read -- forming a p-n junction --

Claim 15, Line 35: Please correct "semiconductor layer and"
  to read -- semiconductor layer; and --

Signed and Sealed this
Fourteenth Day of June, 2011

David J. Kappos
*Director of the United States Patent and Trademark Office*